United States Patent
Daidai et al.

[11] Patent Number: 6,093,996
[45] Date of Patent: Jul. 25, 2000

[54] SURFACE MOUNTING TYPE PIEZOELECTRIC ELEMENT

[75] Inventors: Muneyuki Daidai, Toyama; Toshiaki Sugimura, Tonami, both of Japan

[73] Assignee: Murata Manufacturing Co., Ltd., Japan

[21] Appl. No.: 09/236,242

[22] Filed: Jan. 25, 1999

[30] Foreign Application Priority Data

Feb. 16, 1998 [JP] Japan ................... 10-051339

[51] Int. Cl.[7] ............ H01L 41/053; H03H 9/02
[52] U.S. Cl. ............................... 310/340; 310/348
[58] Field of Search ......................... 310/340, 344, 310/347, 348, 349

[56] References Cited

U.S. PATENT DOCUMENTS

| | | | |
|---|---|---|---|
| 4,742,182 | 5/1988 | Fuchs | 174/52 FP |
| 5,525,855 | 6/1996 | Gotoh et al. | 310/344 |
| 5,808,397 | 9/1998 | Kotani | 310/348 |
| 5,875,099 | 2/1999 | Maesaka et al. | 361/760 |
| 5,889,357 | 3/1999 | Yachi et al. | 310/344 |
| 5,942,836 | 8/1999 | Yoshida et al. | 310/320 |

*Primary Examiner*—Thomas M. Dougherty
*Attorney, Agent, or Firm*—Graham & James LLP

[57] ABSTRACT

A surface mounting type piezoelectric component includes an insulating substrate, an external electrode disposed on the insulating substrate, and a piezoelectric element including an electrode. The piezoelectric element is fixed to the insulating substrate and the electrode of the piezoelectric element is connected to the external electrode. A metal cap is fixed to the insulating substrate via an adhesive agent and covers the piezoelectric element. A glass transition temperature of the adhesive agent in a cured state is about 120 degrees centigrade or more. A difference between absolute values of a thermal-expansion-coefficient of the metal cap and of the insulating substrate is about 8 ppm/degrees centigrade or less.

20 Claims, 4 Drawing Sheets

FIG. 6

The relationship between the glass transition temperature of the adhesive agent and a cap detachment incidence rate

| Glass transition temperature (°C) | 84 | 102 | 120 | 140 | 174 | 210 | 226 |
|---|---|---|---|---|---|---|---|
| Cap detachment incidence rate | 20/100 | 3/100 | 0/100 | 0/100 | 0/100 | 0/100 | 0/100 |

FIG. 7

The difference of thermal-expansion-coefficients between the substrate and the cap

| Material of the substrate | Material of the cap | The difference of thermal-expansion-coefficients (ppm/°C) |
|---|---|---|
| 96° alumina | 42Ni | 2.7 |
| Low-temperature sintered ceramic | German Silver | 4.2 |
| Low-temperature sintered ceramic | 42Ni | 7.6 |
| 99° alumina | German Silver | 8.0 |
| 96° alumina | German Silver | 9.1 |
| Low-temperature sintered ceramic | Aluminium | 11.1 |

FIG. 8

The relationship between an adhesive-agent physical property / a thermal-expansion-coefficient difference and a thermal shock resistance

| Adhesive-agent physical property | | Thermal-expansion-coefficient difference (ppm/°C) | | | | | |
|---|---|---|---|---|---|---|---|
| Glass transition temperature (°C) | Elasticity coefficient (MPa) | 2.7 | 4.2 | 7.6 | 8.0 | 9.1 | 11.1 |
| 84 | 5700 | G | G | G | G | G | NG |
| 174 | 7500 | G | G | G | G | NG | NG |
| 226 | 8000 | G | G | G | G | NG | - |

SURFACE MOUNTING TYPE PIEZOELECTRIC ELEMENT

BACKGROUND OF THE INVENTION

1. Field of the Invention

The present invention relates to surface mounting type piezoelectric components, such as a ceramic oscillator and a ceramic filter.

2. Description of the Related Art

Conventionally, in a surface mounting type piezoelectric component, in order to perform a cleaning process at the time of mounting the piezoelectric component on a substrate, a fluid-resistant characteristic is required for a product incorporating the piezoelectric component and the substrate.

In order to reliably provide a fluid-resistant characteristic, an adhesive agent is disposed between a cap and an insulating substrate upon which the piezoelectric component is mounted. More specifically, after mounting the piezoelectric component such as an oscillator element on the insulating substrate made of alumina, for example, and on which an electrode is disposed, a cap made from alumina is put on and sealed with the insulating substrate via the adhesive agent.

However, the cap made from alumina has very high molding and baking costs. Furthermore, a thickness of the cap must be at least about 0.5 mm because of the manufacturing process used to form the cap. Because the piezoelectric oscillator is usually used together with an integrated circuit (IC), it is preferable that the height or vertical dimension of a complete product incorporating the oscillator and the IC is equal to or less than that of the IC. The height or vertical dimension of the IC has become very small in recent years (for example, about 1.2 mm). For this reason, when using the cap made from alumina, sometimes the desired height of the product could not be realized.

In order to decrease the height or vertical dimension of the product, a metal cap has been proposed. Unexamined Japanese Patent Publication No. 8-111626 discloses a piezoelectric component, wherein a metal cap is fixed to a substrate and a space defined between the metal cap and the substrate is sealed via an adhesive agent. The adhesive agent has a physical property which alleviates the effect of any difference in a thermal expansion coefficient of the metal cap and of the substrate. In this case, the height or vertical dimension of a resulting product can be made low, and the piezoelectric element does not suffer negative effects such as a dipole and degradation of the sealing condition caused by heat shock or other environmental conditions can be suppressed.

Incidentally, a surface mounting type piezoelectric component is soldered to a circuit board via a reflow process. In the case of reflow soldering, a maximum temperature reaches 250 degrees centigrade, for example. Therefore, if the heat resistance of an adhesive agent is low, a sealing portion of an insulating substrate (circuit board) and a cap cannot tolerate an increase in the internal pressure of the cap accompanied by a temperature rise, and consequently, the cap is detached from the substrate.

Moreover, when the difference between the thermal expansion coefficients of the cap and the substrate is too large, even if the adhesive agent which has the physical property which alleviates the difference between thermal expansion coefficients is used, the cap detachment can not be prevented in many cases.

SUMMARY OF THE INVENTION

To overcome the problems described above, preferred embodiments of the present invention provide a surface mounting type piezoelectric component which has an excellent reflow-resistant property and an excellent thermal shock resistance which reliably prevents cap detachment.

One preferred embodiment of the present invention provides a surface mounting type piezoelectric component which includes an insulating substrate, an external electrode disposed on the insulating substrate, a piezoelectric element including an electrode and being fixed to the insulating substrate such that the electrode of the piezoelectric element is connected to the external electrode, and a metal cap fixed to the insulating substrate via an adhesive agent and covering the piezoelectric element, wherein a glass transition temperature of the adhesive agent in a cured state is equal to or greater than about 120 degrees centigrade and a difference between absolute values of the thermal-expansion-coefficient of the metal cap and the insulating substrate is equal to or less than about 8 ppm/degrees centigrade.

It was discovered and confirmed by testing actual examples of preferred embodiments of the present invention that the incidence rate of cap detachment at the time of reflow soldering is correlated with the glass transition temperature of an adhesive agent. More specifically, it was discovered that the incidence rate of cap detachment becomes lower as a glass transition temperature becomes higher. However, if the difference between absolute values of the thermal-expansion-coefficient of a cap and an insulating substrate exceeds about 8 ppm/degrees centigrade, cap detachment occurs even if an adhesive agent having a high glass transition temperature is used.

According to preferred embodiments of the present invention, the glass transition temperatures of the adhesive agent used for bonding and sealing the insulating substrate and the cap is preferably equal to or greater than about 120 degrees centigrade. As a result, even during heating at the time of reflow soldering, an adhesive strength is not reduced, and the adhesive agent can tolerate an increase in the internal pressure.

Also, the difference between absolute values of thermal expansion coefficients of the cap and of the insulating substrate is preferably about 8 ppm/degrees C or less. As a result, stress in the adhesive agent is alleviated and the detachment of the cap from the substrate is reliably prevented.

In the above described surface mounting type piezoelectric component, the adhesive agent is preferably an epoxy system adhesive agent. By using such an adhesive agent, a very high adhesive strength of a bond between the metal cap and the substrate can be obtained, and the adhesive can be hardened at low temperature (about 180 degrees centigrade or less) such that the piezoelectric element does not cause a dipole.

Other features and advantages of the present invention will become apparent from the following description of preferred embodiments of the invention which refers to the accompanying drawings.

BRIEF DESCRIPTION OF DRAWINGS

FIG. 6 is a table showing the relationship between the glass transition temperature of the adhesive agent and a cap detachment incidence rate.

FIG. 7 is a table showing the difference between thermal-expansion-coefficients of the substrate and the cap.

FIG. 8 is a table showing the relationship between an adhesive-agent physical property and a thermal shock resistance, and between a thermal-expansion-coefficient difference and the thermal shock resistance.

DETAILED DESCRIPTION OF PREFERRED EMBODIMENTS

Figure 1:
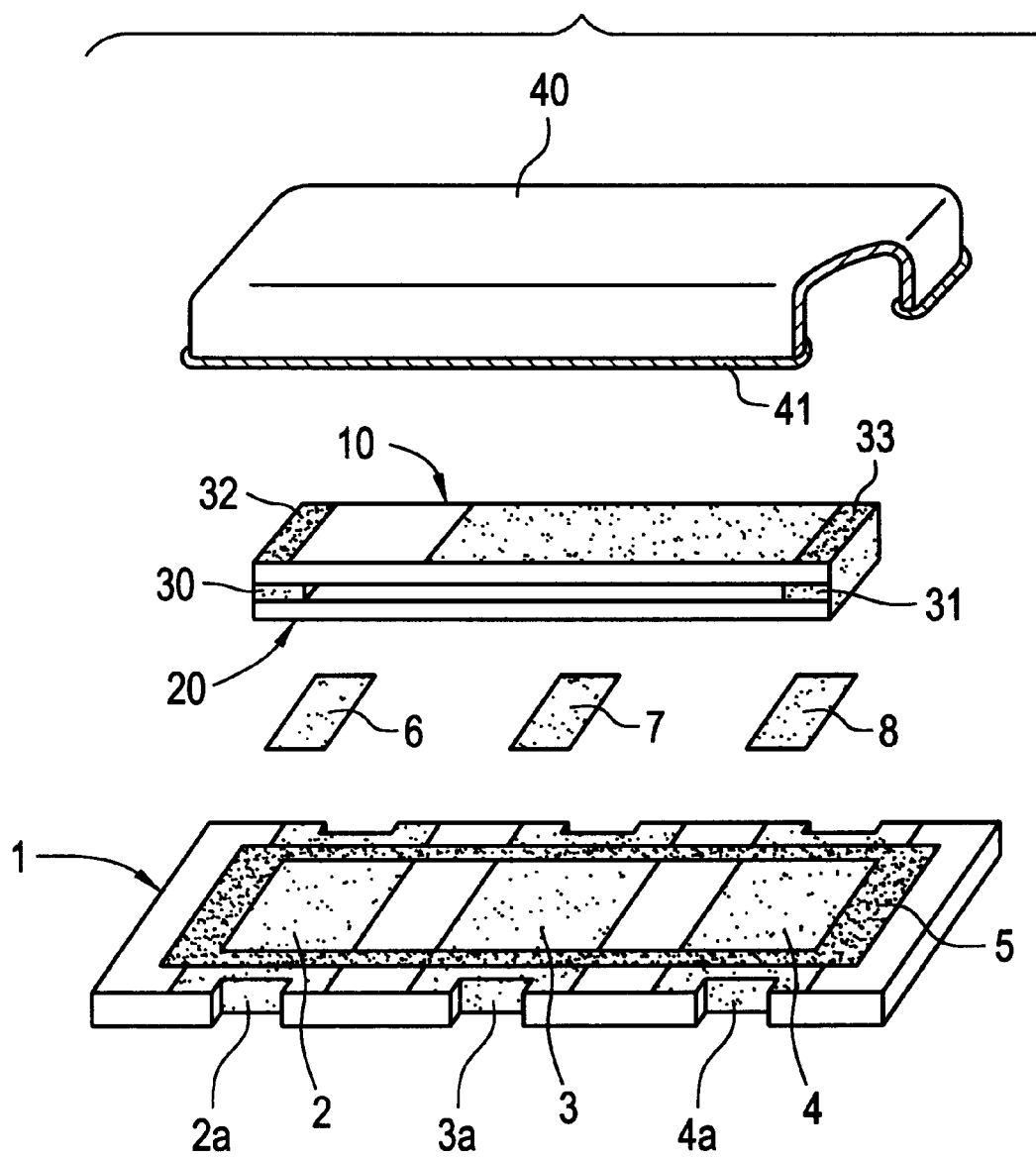
FIG. 1 is an exploded perspective view of one preferred embodiment of a surface mounting type piezoelectric component of the present invention.
Figure 2:
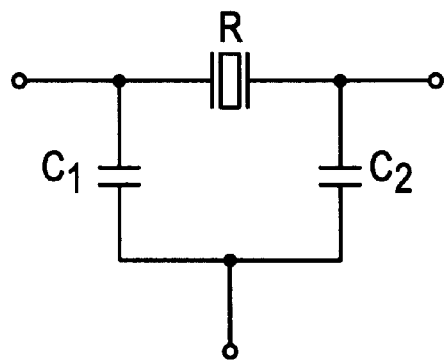
FIG. 2 is a circuit diagram of the piezoelectric component shown in FIG. 1.

FIG. 1 shows a surface mounting type piezoelectric component according to one preferred embodiment of the present invention. This piezoelectric component preferably includes one oscillator element R and a load capacitance built-in type oscillator including two capacitors C1, C2 which are used for a Colpitts type oscillation circuit. A circuit diagram thereof is shown in FIG. 2.

An insulating substrate 1 is preferably a substantially rectangular thin plate having a thickness of about 0.4 mm and made of an alumina, low-temperature-sintering ceramic, for example. Three external electrodes 2–4 are disposed on an approximate center portion and both end portions of a front surface and a back surface of the substrate 1, respectively.

The end portions of the electrodes 2–4 are respectively extended out to the convex through-hole portions 2a–4a provided along both of the long side edge portions of the substrate 1. The external electrodes 2–4 provided on the front and back surfaces of the substrate 1 are connected to each other via the electrodes provided on the interior of the convex through-hole portions 2a–4a.

A frame-shaped insulator layer 5 having a shape which corresponds to a portion of the substrate 1 where a cap is fixed, is disposed on the external electrodes 2–4 on the front surface of the substrate 1 and has a substantially uniform thickness. The insulator layer 5 may include a resin base, a glass base, or other suitable material. To form the insulator layer 5, well-known methods such as printing, transfer, and dispensing, are able to be used.

A multilayer body formed by laminating an oscillator element 10 and a capacitor element 20 is fixed on the substrate 1 via material 6–8. The material 6–8 has conductivity and an adhesive function, such as an electroconductive glue.

Figure 3:
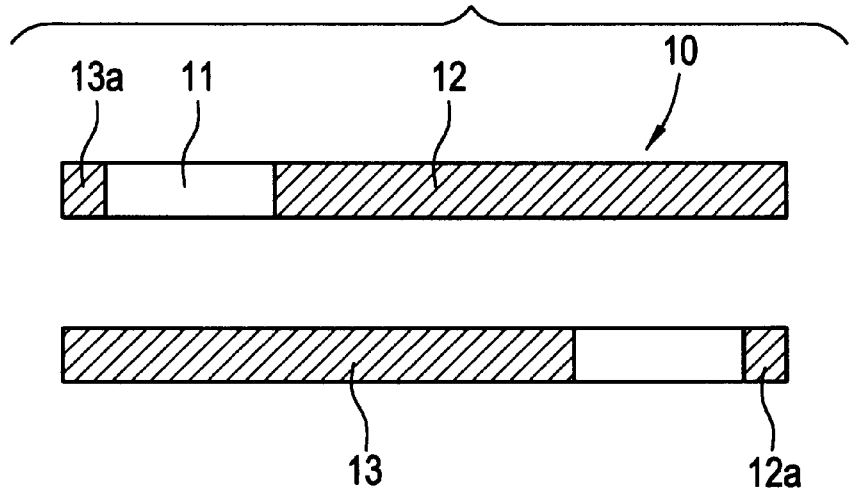
FIG. 3 is a front view and a back view of an example of an oscillator element used in the piezoelectric component shown in FIG. 1.

The oscillator element 10 used in this preferred embodiment is preferably an oscillator element adapted to vibrate in a thickness shear vibration mode. As shown in FIG. 3, an electrode 12 is arranged to extend about ⅔ along the longitudinal direction of the front surface of the piezoelectric substrate 11 from a first end portion thereof. An electrode 13 is arranged to extend about ⅔ along the longitudinal direction of the back surface of the piezoelectric substrate 11 from a second end portion thereof. One end portion of the electrode 12 and one end portion of electrode 13 are opposed to each other via the piezoelectric substrate 11 at the approximate center portion thereof and thereby, an oscillating portion is provided. The other end portions 12a and 13a of the electrodes 12 and 13 respectively extend to the opposing surface of the substrate 1 via respective end portions of the substrate 1.

Figure 4:
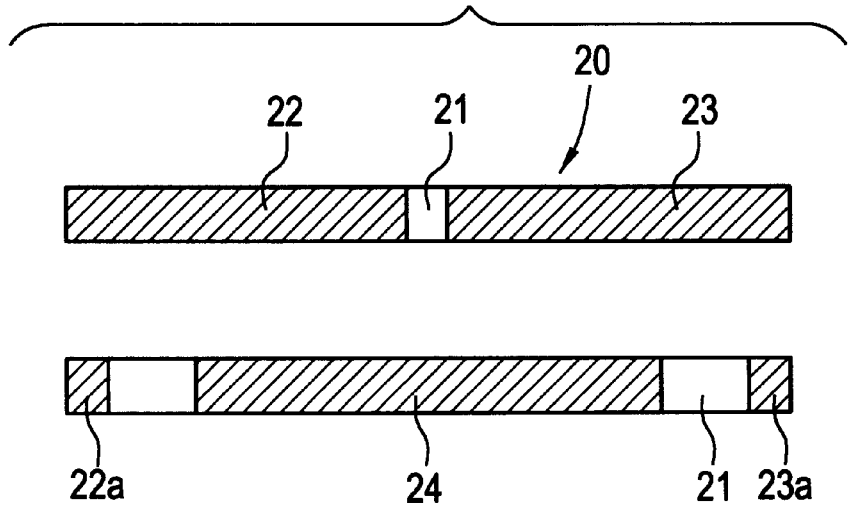
FIG. 4 is a front view and a back view of an example of a capacitor element used in the piezoelectric component shown in FIG. 1.

Moreover, the capacitor element 20 shown in FIG. 4 preferably includes a dielectric substrate 21 (ceramic substrate, for example) having substantially the same length and width as the oscillator element 10, and including individual electrodes 22 and 23 and an opposing electrode 24. The individual electrodes 22 and 23 respectively extend from opposing end portions to the approximate center portion at the front surface of the dielectric substrate 21, and the opposing electrode 24 is disposed on the back surface of the dielectric substrate 21 and opposed to the individual electrodes 22 and 23, thereby two capacitance portions are provided at locations where the individual electrodes 22 and 23 and the opposing electrode 24 are opposed each other via the dielectric substrate 21. The respective end portions 22a and 23a of the individual electrodes 22 and 23 extend to the back surface of the dielectric substrate 21 via respective end portions thereof.

Bonding and fixing of the back surface of the oscillator element 10 and the front surface of the capacitor element 20 is performed at both ends thereof via materials 30 and 31 such as an electroconductive glue which has conductivity and an adhesive function. At this time, an oscillating space is defined by the thickness of the materials 30 and 31 disposed between the oscillating portion of the oscillator element 10 and the capacitor element 20. In this way, one electrode 13 of the oscillator element 10 and one individual electrode 22 of the capacitor element 20 are connected, and the other electrode 12 and the other individual electrode 23 are connected. In addition, damping materials 32 and 33 for achieving frequency adjustment and preferably made of resin or other suitable materials are preferably provided on both ends of the surface of the oscillator element 10. However, the damping materials 32 and 33 are not necessarily required.

When the back surface of the capacitor element 20 is bonded to the substrate 1 via materials 6–8 after integrating the oscillator element 10 and the capacitor element 20 via bonding, an edge-portion 22a of one individual electrode 22 disposed on the capacitor element 20 is connected with the electrode 2. An edge-portion 23a of the other individual electrode 23 is connected to the electrode 4 as well. The opposing electrode 24 is connected to an electrode 3.

A cap 40 is bonded to the substrate 1 via an adhesive agent 41 such that the oscillator element 10 and the capacitor element 20 are covered. The cap 40 is preferably formed of a Ni alloy, such as a 42Ni alloy, and preferably has a thickness is about 0.1 mm. Non-electrolytic Ni plating is applied on the surface of the Ni alloy material. As the adhesive agent 41, an adhesive agent having a glass transition temperature of about 120 degrees centigrade or more is preferably used. After the adhesive agent 41 is coated on the bottom surface of the opening of the cap 40 by a transfer process, the cap 40 is bonded on the insulator layer 5. Then, the adhesive agent 41 is cured. In this preferred embodiment, the adhesive agent having a glass transition temperature of about 174 degrees centigrade and an elasticity coefficient at a room temperature of about 7500 MPa is used.

The characteristics and features of the above-described preferred embodiments of the present invention were confirmed in various examples described with reference to FIGS. 5–8.

Figure 5:
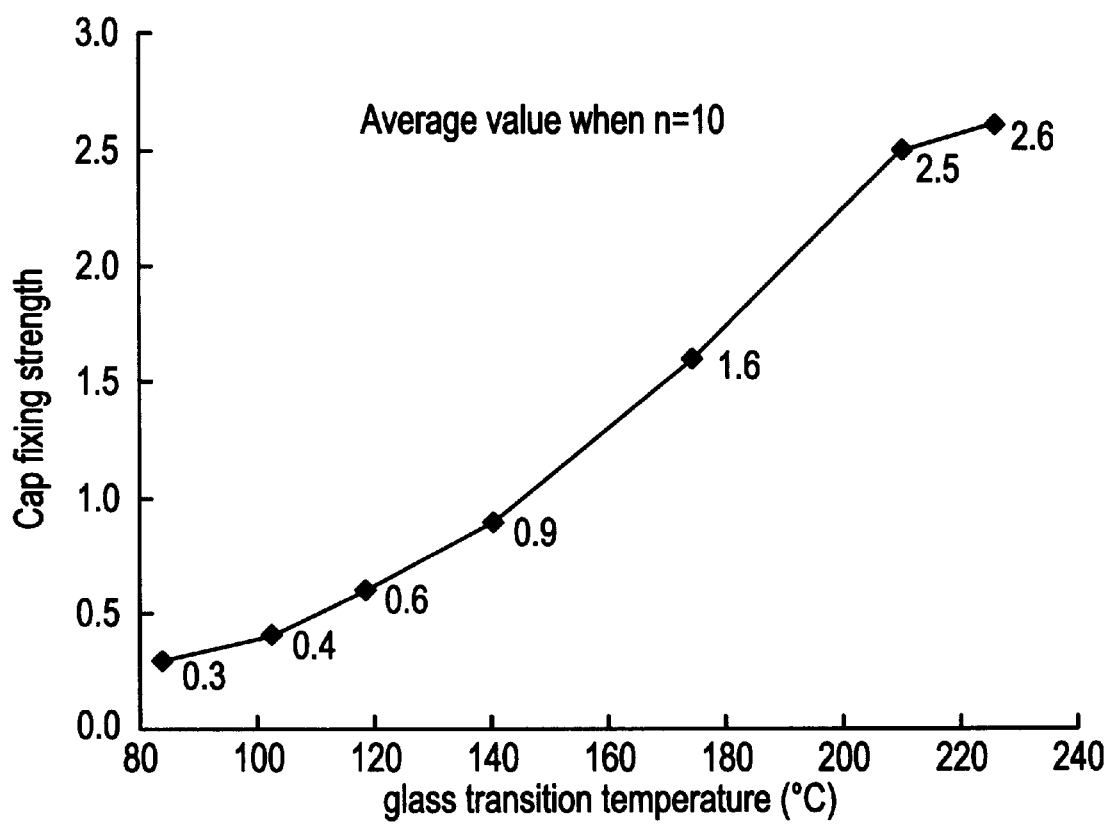
FIG. 5 is a diagram showing the relationship between a glass transition temperature of an adhesive agent and a cap fixing strength.

FIG. 5 shows the relationship between the glass transition temperature of the adhesive agent 41 and a fixing strength of the cap 40. In FIG. 5, the fixing strength of the cap is indicated by the load value when the cap 40 is peeled from the substrate 1 by pulling the cap 40 along a direction perpendicular to the substrate 1. In this case, the area of the opening of the cap 40 used is about 11 mm$^2$, and the area where the cap 40 is bonded on the substrate is about 5 mm$^2$. As is clearly shown in FIG. 5, as the glass transition temperature of the adhesive agent 41 becomes high, the fixing strength becomes large.

FIG. 6 shows the relationship between a glass transition temperature and the detachment incidence rate of the cap at the time of reflow soldering. The test sample used here was produced by the same method as the preferred embodiment of FIG. 1 using the adhesive agent in which a glass transition temperature differs. After these samples were set aside for 24 hours in an environment having a certain humidity (85 degrees centigrade/85RH), 100 pieces of the samples were put into a reflow furnace (peak temperature of 250 degrees centigrade). The number of the samples from which the cap separated at this time was counted. The counting method was performed by viewing, and further, by using the gross leakage test. The gross leakage test was performed by the following method. A sample was soaked in fluorocarbon liquid having a temperature of 125 degrees centigrade for sixty seconds. The existence of air bubbles was detected with the naked eye. Consequently, as shown in FIG. 6, when a glass transition temperature becomes 120 degrees centigrade or more, the detachment of a cap from a substrate does not occur.

FIG. 7 shows the difference of the thermal expansion coefficient when combining several kinds of substrates 1 and the cap 40. The finished-product sample of these combinations was produced and the thermal shock test was performed on them. At this time, the samples were tested by determining the three-level adhesive-agent physical properties.

FIG. 8 shows the relationship between the physical property and the difference between a thermal expansion coefficient of the adhesive agent 41 and the thermal shock resistance. The thermal shock test was performed under 1000 cycles of −55 degrees centigrade (30 minutes) to +125 degrees centigrade (30 minutes). The number of samples was 30 pieces per each condition. The evaluation was done using an optical microscope. When abnormalities, such as peeling and a crack were found among a bond sealing portion on any of the samples, the product was determined to be inferior or defective.

As is clearly shown in FIG. 8, when the difference of the thermal expansion coefficient of the substrate 1 and the cap 40 is about 8 ppm/degrees C or less, even if any kind of adhesive agent is used, inferior or defective goods are not produced as determined by the thermal shock test. In addition, the glass transition temperature of about 226 degrees centigrade is close to the highest level for the epoxy adhesive agent.

The discoveries relating to preferred embodiments of the present invention and the results confirmed in the above-described examples are explained as follows. In order to obtain a significant and sufficient reflow-resistant property, a glass transition temperature of an adhesive agent needs to be equal to or greater than about 120 degrees centigrade. Moreover, in order to obtain a sufficient thermal shock resistance, the difference between absolute values of the thermal-expansion-coefficient of a cap and an insulating substrate needs to be less than or equal to about 8 ppm/degrees centigrade. If these conditions are satisfied, the detachment (sealing degradation) of a cap from a substrate is reliably prevented.

The present invention is not limited to the above described preferred embodiments. Of course, various modifications are possible. For example, the piezoelectric component of the present invention is applicable to all kinds of surface mounting type piezoelectric components, such as an oscillator in which a load capacitance is not built in and a filter in which a load capacitance is built in. Moreover, neither the shape of a piezoelectric element, nor the shape of a capacitor element is limited to the above described preferred embodiments. Further, in addition to the thickness shear vibration mode, any kind of vibration mode such as a thickness extensional vibration mode and a square type vibration mode are applicable for the piezoelectric element of the present invention. With respect to the shape of the cap, a hut-shape in which an opening portion extends along an outward direction is also suitable for the present invention. In this case, a large bonding area can be obtained. Moreover, the insulating substrate may be made of other insulating materials such as a glass epoxy resin in addition to an alumina substrate. Furthermore, the material of the cap is not restricted to 42Ni. German silver, aluminum, or other suitable materials can be used for the cap. However, in the case of aluminum, a thermal expansion coefficient is large. Therefore, when aluminum is used for the cap, it is difficult to make the thermal-expansion-coefficient difference between the aluminum and the substrate (ceramic) to be about 8 ppm/degrees centigrade or less. For this reason, it is preferable to use 42Ni or a German silver. As the adhesive agent, adhesive agents such as epoxy-acrylate or other suitable materials can also be used, in addition to an epoxy adhesive agent. However, the adhesive agent is required to satisfy the conditions of the present invention including having a glass transition temperature of about 120 degrees centigrade or more.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric component, comprising:

an insulating substrate;

an external electrode disposed on said insulating substrate;

a piezoelectric element including an electrode, said piezoelectric element being fixed to said insulating substrate and said electrode of said piezoelectric element being connected to said external electrode;

an adhesive agent; and a cap fixed to said insulating substrate via said adhesive agent and covering said piezoelectric element; wherein a glass transition temperature of said adhesive agent in a cured state is equal to or greater than about 120 degrees centigrade; and a difference of absolute values of a thermal-expansion-coefficient of said cap and of said insulating substrate is less than or equal to about 8 ppm/degrees centigrade.

2. The piezoelectric component according to claim 1, wherein said adhesive agent is an epoxy system adhesive agent.

3. The piezoelectric component according to claim 1, wherein said piezoelectric element includes at least one oscillator element and a load capacitance built-in type oscillator including two capacitors which are arranged to define a Colpitts type oscillation circuit.

4. The piezoelectric component according to claim 1, wherein said insulating substrate comprises a substantially rectangular thin plate.

5. The piezoelectric component according to claim 1, wherein said insulating substrate is made of an alumina, low-temperature-sintering ceramic.

6. The piezoelectric component according to claim 1, wherein said piezoelectric component is a surface mounting type component.

7. The piezoelectric component according to claim 1, further comprising an insulating member disposed between the insulating substrate and the piezoelectric element.

8. The piezoelectric component according to claim 1, wherein said insulating substrate includes convex through-hole portions at edges thereof.

9. The piezoelectric component according to claim 8, wherein a plurality of external electrodes are provided on said insulating substrate and end portions of said plurality of external electrodes are respectively extended out to the convex through-hole portions.

10. The piezoelectric component according to claim 8, wherein said plurality of external electrodes are provided on front and back surfaces of said insulating substrate and are connected to each other via electrodes provided on an interior of the convex through-hole portions.

11. The piezoelectric component according to claim 1, wherein the piezoelectric element includes an oscillator element and a capacitor element.

12. The piezoelectric component according to claim 11, wherein the oscillator element and the capacitor element are laminated on each other to form an integral member.

13. The piezoelectric component according to claim 11, wherein the oscillator element is adapted to vibrate in a thickness shear vibration mode.

14. The piezoelectric component according to claim 1, wherein said cap is formed of a Ni alloy.

15. The piezoelectric component according to claim 14, wherein a non-electrolytic Ni plating is applied on the surface of the Ni alloy.

16. The piezoelectric component according to claim 1, wherein said cap is formed of 42Ni alloy.

17. The piezoelectric component according to claim 16, wherein a non-electrolytic Ni plating is applied on the surface of the 42Ni alloy.

18. The piezoelectric component according to claim 1, wherein said adhesive agent has a glass transition temperature of about 174 degrees centigrade and an elasticity coefficient at a room temperature of about 7500 MPa.

19. The piezoelectric component according to claim 1, wherein said cap is made of at least one of German silver and aluminum.

20. The piezoelectric component according to claim 1, wherein said adhesive agent includes at least one of epoxy-acrylate and an epoxy adhesive agent.

* * * * *